United States Patent [19]
Gelbien

[11] Patent Number: 5,952,734
[45] Date of Patent: Sep. 14, 1999

[54] APPARATUS AND METHOD FOR MAGNETIC SYSTEMS

[75] Inventor: Mark Gelbien, Levittown, N.Y.

[73] Assignee: Fonar Corporation, Melville, N.Y.

[21] Appl. No.: 08/872,352

[22] Filed: Jun. 10, 1997

Related U.S. Application Data

[63] Continuation of application No. 08/388,827, Feb. 15, 1995, abandoned.

[51] Int. Cl.$^6$ .................................................. H04B 15/00
[52] U.S. Cl. ........................... 307/91; 307/104; 324/307; 324/313; 361/143; 361/146; 361/144; 335/209
[58] Field of Search ..................... 307/91, 104; 324/320, 324/313, 200, 219, 258, 254, 262, 260, 261, 247, 76.14, 76.75, 76.79, 144, 307; 361/139, 143, 149, 150, 159, 146; 335/213, 297, 299, 209

[56] References Cited

U.S. PATENT DOCUMENTS

| | | | |
|---|---|---|---|
| H471 | 5/1988 | Visser | 324/260 |
| 2,861,242 | 11/1958 | Leavitt | 324/254 |
| 3,801,877 | 4/1974 | Griese | 361/146 |
| 3,808,508 | 4/1974 | Ford | 361/140 |
| 3,872,382 | 3/1975 | Bertram et al. | 324/258 |
| 4,262,427 | 4/1981 | Lynch et al. | 324/260 |
| 4,362,992 | 12/1982 | Young et al. | 324/247 |
| 4,918,824 | 4/1990 | Farrar | 324/244 |
| 4,932,951 | 6/1990 | Liboff | 606/13 |
| 4,933,637 | 6/1990 | Ueda | 324/260 |
| 4,977,374 | 12/1990 | Kleiner | 324/254 |
| 5,130,655 | 7/1992 | Conti | 324/258 |
| 5,329,416 | 7/1994 | Ushiyama | 361/146 |
| 5,465,012 | 11/1995 | Dunnam | 307/91 |
| 5,469,058 | 11/1995 | Dunnam | 324/258 |

OTHER PUBLICATIONS

Second International Conference on "Developments in Power–System Protector", Jun. 10–12, 1980, pp. 10–14.
"Accurate measurement of d.c. and a.c. by transformer"; M. Groenenboom and J. Lisser, C. Eng., M.I.E.E.
Magnetic Amplifiers: "The Harmonic Type Magnetic Amplifier"; G.M. Ettinger, 1953; pp. 38–45.

*Primary Examiner*—Albert W. Paladini
*Attorney, Agent, or Firm*—Morgan & Finnegan, L.L.P.

[57] ABSTRACT

A coil for bucking out undesired ambient time varying magnetic fields in the region of the gap in an MRI magnet structure is energized by a servo loop controlled by a Flux Lock Circuit having, in turn, a closed loop circuit controlled by a magnetic sensor. The sensor has a pair of windings energized in parallel by a 2 KHz oscillator, the windings being oppositely poled to induce zero voltage in a third winding to which feedback signals are supplied. Extraneous fields cause an asymmetry in the current passing through the pair of windings which asymmetry is accompanied by the generation of second harmonic components which are detected and fed back to the third winding for restoring symmetry. The signal fed back to the third winding is also used for controlling the current supplied to the field bucking coil.

59 Claims, 2 Drawing Sheets

APPARATUS AND METHOD FOR MAGNETIC SYSTEMS

This application is a continuation of application Ser. No. 08/388,827, filed Feb. 15, 1995 now abandoned.

BACKGROUND OF THE INVENTION

The present invention relates to a method and apparatus for maintaining a constant magnetic field environment for a device the performance of which is adversely affected by time varying and static extraneous magnetic fields, and more particularly for reducing interference with the magnetic field of a magnetic resonance imaging (MRI) system.

In a typical MRI system, a magnetic structure is provided for developing a strong magnetic field within a gap within which a patient or other body is placed for examination. Typically, the magnetic field strength in the patient receiving gap is greater than 300 gauss. In addition to a strong magnetic field, medical magnetic resonance studies require a magnetic field stability of the order of a few parts per million.

Often it is necessary to locate an MRI system in areas that have changing environmental magnetic fields. For instance, the system may be located near a conductor carrying large currents which conductor is surrounded by a strong magnetic field. This field impacts upon the field produced by the magnetic structure of the MRI machine. The third rail or overhead wire of an electrical railway is an example. If the current through the conductor remains constant, the MRI machine can be calibrated to allow for the field produced by the conductor. However, if the current through the conductor varies for any reason, the changing magnetic field must be compensated for in order to maintain a desired level of MRI machine performance. A previous method for maintaining a constant value of the environmental magnetic field involves placing a measuring device such as a gauss meter in the near environment of the magnetic structure although out of the path of any leakage flux. The signal produced by the gauss meter is used to drive a large two-coil assembly where the MRI device magnetic structure is located between the two coils. The current in the two coils is varied until no variation of the magnetic field can be detected in the MRI magnet gap. Unfortunately, this method has many limitations. First, the gauss meter probe cannot be placed in the same space as the MRI magnet because the fringe field of the MRI magnet would saturate the probe. Second, the gauss meter provides essentially an open loop control system which requires constant re-calibration to maintain a constant field in the MRI magnet gap. Finally, the sensitivity of the gauss meter is not adequate for the resolution desired.

SUMMARY OF THE PRESENT INVENTION

It is, therefore, an object of the present invention to provide an improved and more sensitive method for eliminating the adverse effects of externally originating magnetic field disturbances.

In accordance with one aspect of the present invention there is provided a method for providing a constant magnetic field environment which comprises in combination the steps of employing a closed loop feedback circuit with a magnetic sensor in a location to provide a control signal, and employing the control signal in a closed loop feedback system for producing a magnetic field flux of a magnitude and direction to cancel the unwanted time varying magnetic flux. A closed loop system is a system in which a feedback signal is summed with a reference and the resultant signal, which may be amplified and/or conditioned, is used to achieve the desired effect. The closed loop system may comprise one or more of the following elements: a reference input; a summing point; a control element; a controlled system; and a feedback element.

In accordance with another aspect of the present invention there is provided apparatus for providing a constant magnetic field environment in at least one direction for a device. The apparatus comprises a magnetic field generating coil for providing a magnetic field flux component in at least the one direction for altering the magnetic field flux in that one direction. Means are coupled to the coil for supplying energizing current of adjustable magnitude and polarity thereto. A closed loop feedback sensing circuit is coupled to the energizing current supplying means for adjusting the energizing current which circuit includes a sensing element disposed relative to the coil where the sensing element is exposed to any magnetic field produced by the coil.

A BRIEF DESCRIPTION OF THE DRAWINGS

The invention will be better understood after reading the following detailed description of the presently preferred embodiment thereof with reference to the appended drawings in which:

FIG. 1 is a simplified schematic diagram of apparatus embodying the present invention; and FIG. 2 is a schematic block diagram of the closed loop sensing circuit forming a portion of the circuit of FIG. 1.

The same reference numerals are used throughout the drawings to designate the same or similar parts.

DETAILED DESCRIPTION OF THE PRESENTLY PREFERRED EMBODIMENT

Figure 1:
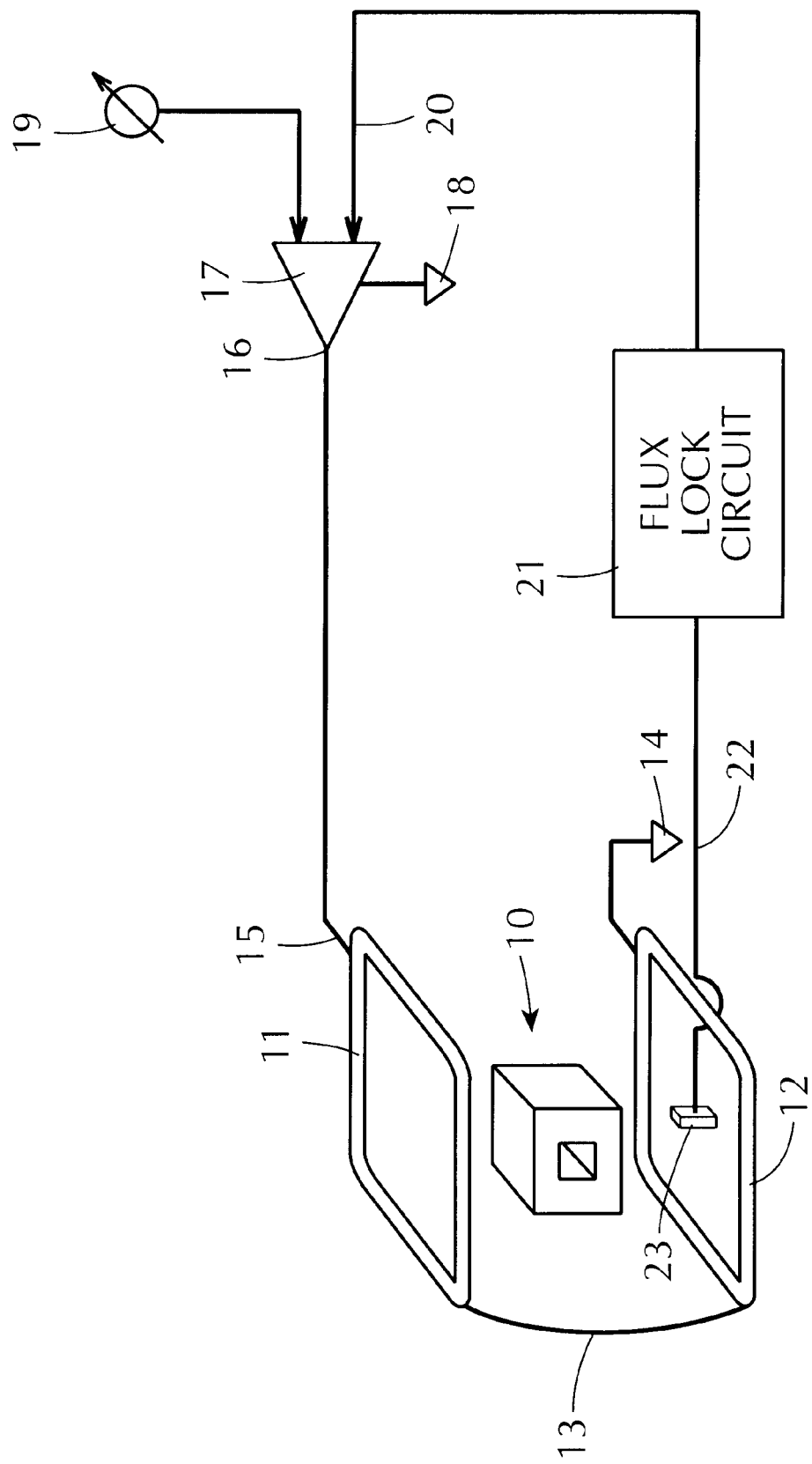

Referring now to FIG. 1, an MRI machine and its magnet structure is represented schematically at 10. The present description assumes an MRI machine in which the flux lines in the patient gap are vertically oriented. Located above the magnet structure 10 is a coil 11, while a second coil 12 is located below the structure 10. As shown, the coils 11 and 12 are connected in series by a connection 13 and between ground at 14 and a connection 15 supplied by the output 16 of a servo amplifier 17. The servo amplifier 17, whose form may be analog, digital, or a combination of analog and digital all in known manner, has a ground return at 18, an adjustable input 19, and a feedback input at 20.

The feedback input at 20 is derived from a Flux Lock Circuit 21 that is coupled over a connection 22 to a sensor 23.

Figure 2:
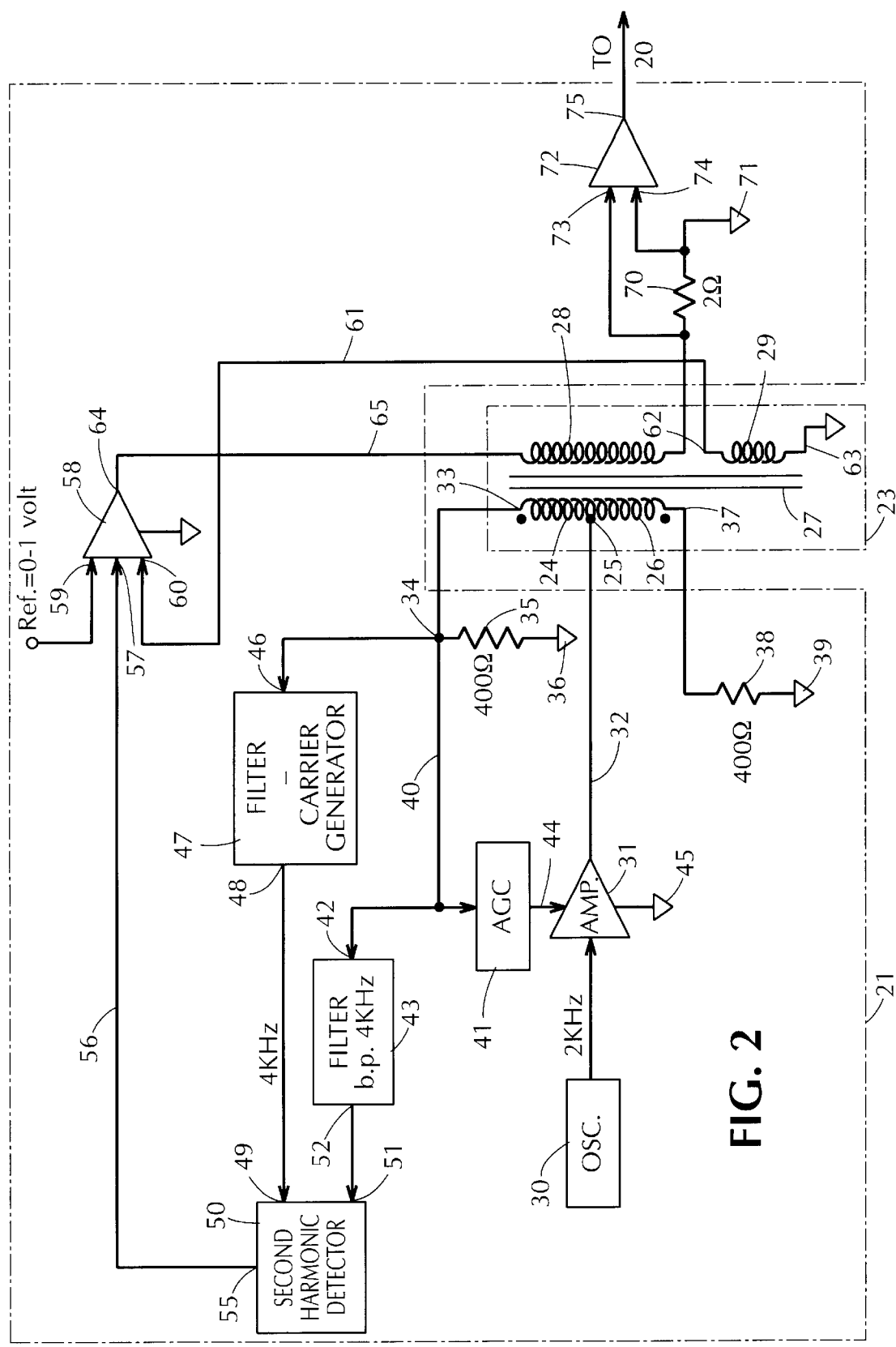

The sensor 23 is shown in detail in FIG. 2. It has a first winding 24 joined at a tap 25 to a second winding 26 with the windings 24 and 26 wound in the same direction. The windings 24 and 26 are formed around a linear core 27 of high permeability material such as permalloy or metglas. Instead of separate windings, there can be one winding with a centertap 25. A third winding 28 is wound around the windings 24 and 26, as well as around a fourth winding 29 which is also wound around the core 27.

Still referring to FIG. 2, the Flux Lock Circuit 21 comprises a 2 KHz oscillator 30 whose output is fed through an amplifier 31 and over a connection 32 to the tap 25 between the windings 24 and 26. As shown in FIG. 2, the free end 33 of the winding 24 is connected to a node 34 which is then connected through a 400 ohm resister 35 to ground at 36. In similar fashion, the free end 37 of the winding 26 is connected through another 400 ohm resister 38 to ground at 39.

The node 34 is connected over a connection 40 to both an automatic gain control (AGC) circuit 41 and the input 42 of a 4 KHz bandpass filter 43. The output of the AGC circuit 41 is connected over a connection 44 to the amplifier 31, which, in turn, is connected to ground at 45.

The node 34 is also connected to an input 46 of a Filter and Carrier Generator 47 having an output at 48 which is connected to an input 49 of a Second Harmonic Detector 50. The Second Harmonic Detector 50 is of the synchronous detection type having a second input 51 derived from an output 52 of the filter 43.

The Second Harmonic Detector 50 has an output at 55 which is connected over a connection 56 to a first input 57 of a servo amplifier 58. The servo amplifier 58 has a second input 59 connected to a source of reference voltage that is adjustable within the range of 0 to 1 volt.

A third input at 60 is provided to the servo amplifier 58 over the connection 61 from the end 62 of the winding 29 whose opposite end 63 is connected to ground.

Finally, the servo amplifier 58 has an output 64 connected over a connection 65 to one end of the winding 28 whose opposite end is connected through a 2 ohm resistor 70 to ground at 71. The circuit is completed by an output amplifier 72 having one input 73 connected to the junction between resistor 70 and winding 28 and a second input 74 connected to ground at 71.

The output at 75 from the amplifier 72 provides the output from the Flux Lock Circuit 21 and is connected to the input 20 of the servo amplifier 17 as shown in FIG. 1.

It should be evident that the coils 11 and 12 constitute a pair of magnetic field generating coils for providing a magnetic field flux component in at least the direction of their common longitudinal axes. As shown in FIG. 1, the common longitudinal axes and direction is vertical and corresponds to the orientation of the field produced in the gap of the device 10, one form of MRI machine. The servo amplifier 17 with its adjustable input 19 constitutes means coupled to the coils 11 and 12 for supplying energizing current of adjustable magnitude and polarity to the coils. The Flux Lock Circuit 21 in conjunction with the sensor 23 constitutes a closed loop sensing circuit that is coupled to the energizing current supplying means just described for adjusting the energizing current. For this purpose the sensing element, sensor 23, is disposed relative to the coils 11 and 12 where the sensing element is exposed to any magnetic field produced by the coils 11 and 12. The sensor 23 in this location is mounted with the longitudinal axis of the core 27 (FIG. 2) oriented vertically. In this location, however, the sensor 23 is also exposed to the stray fields from the MRI device 10 which can be on the order of 20 to 50 gauss. Nevertheless, the present control system can respond to variations in the magnetic flux existing in the region of the sensor 23 in the given direction, here the vertical direction, that are on the order of micro gauss.

The operation of the circuit described with reference to FIGS. 1 and 2 can now be described. The coils 11 and 12 are used to generate a bucking magnetic flux to cancel out the effect of time varying static externally originating ambient fields. With the present system the coils can accomplish this on a continuing basis responding to the time varying environmental components. The coils 11 and 12 can be wound of #10 wire with up to 200 turns per coil in a square or circular fashion and interconnected in series with additive magnetic polarity. These coils can be on the order of 50 feet in perimetric dimension, either circular or rectilinear.

The oscillator 30 provides a 2 KHz output signal which is amplified by the amplifier 31 and maintained at a constant amplitude by the feedback through the AGC circuit 41. The two windings 24 and 26 that are energized by the output of amplifier 31 are in phase opposition such that, barring any asymmetric saturation, there will be no voltage induced in either winding 28 or winding 29. The amplitude of the signal supplied by amplifier 31 is such that it saturates the high permeability material of the core 27 symmetrically on the positive and negative going peaks of the waveform as long as no time varying magnetic field vertical flux components are present. The AGC circuit 41 responds to the voltage across the 400 ohm resistor 35. The AGC circuit 41, in known manner, rectifies and filters the signal appearing across resistor 35. The resulting DC signal is used to control and maintain the 2 KHz voltage across the resistor 35 at a constant level and thereby maintain the energization of the windings 24 and 26 at a constant level.

The voltage across the resistor 35 is also used by the Filter and Carrier Generator 47 to produce the carrier signal for the Second Harmonic Detector 50. The Filter and Carrier Generator 47 rectifies the signal across the resistor 35 and passes it through its own 4 KHz bandpass filter (not shown) to output a 4 KHz sine wave. This is supplied to the Second Harmonic Detector 50.

The signal across the resistor 35 is also supplied through the bandpass filter 43 to the Second Harmonic Detector 50. If there is no lack of symmetry in the signal across the resistor 35, it will have primarily a fundamental frequency of 2 KHz and essentially no second harmonic component. However, should the signal across the resistor 35 become asymmetric, a second harmonic at 4 KHz will be present and will pass through the filter 43. Since the Second Harmonic Detector 50 is of the synchronous demodulator type, it mixes the carrier generated by the Filter and Carrier Generator circuit 47 with the output of the filter 43 producing a DC output signal whose amplitude is proportional to the lack of symmetry of the voltage appearing across the resistor 35. This asymmetry, in turn, is proportional to the level of the unwanted magnetic field flux linked with the high permeability core 27 of the sensor 23.

The output from the Second Harmonic Detector 50 is applied to the servo amplifier 58 over connection 56 where it is compared with the reference voltage at input 59. The difference between the inputs 56 and 59 is used to drive the winding 28 in the sensor 23. In essence, the servo amplifier 58 maintains a balanced magnetomotive force (MMF) in the sensor 23. The current through the winding 28 is applied by way of resistor 70 to the output amplifier 72.

The additional or fourth winding 29 is used to control fast or high frequency changing magnetic fields which are beyond the bandwidth of the windings 24 and 26. Any fast change in magnetic flux in the core 27 will induce a voltage in the winding 29 which will cause a change in the output of the servo amplifier 58 tending to counteract the original flux deviation.

While the sensor has been shown below the MRI apparatus 10, it could be located above. Also, it should now be apparent that if the working gap field flux of the device 10 is oriented other than vertically, the coils 11 and 12 as well as the sensor 23 should be similarly re-oriented so that the respective longitudinal axes are all parallel to the direction of the field flux in the gap of the device 10.

It should be understood by those skilled in the present art that the system described herein can be implemented using either analog or digital components or combinations thereof.

While the embodiment described herein employs two field generating coils 11 and 12 connected in series, it is contemplated that the invention can be applied to a single coil which might be located around the equator of the device being protected.

The frequency of oscillator 30 was selected to be 2 KHz as affording a suitable balance between sensor bandwidth and oscillator current. This frequency value is not especially critical. During development of the present invention frequencies were used in the range of 100 Hz to 3 KHz.

Having described the present invention with reference to the presently preferred embodiment thereof, it should be apparent to those skilled in the subject art that various changes can be effected without departing from the true spirit of the invention as defined in the appended claims. For example, the device 10 can be any apparatus employing a strong unidirectional magnetic field flux the operation of which is adversely affected by changing ambient fields such as that from nearby railway power rails or the like.

What is claimed is:

1. A method for providing a constant magnetic field environment which comprises in combination the steps of employing a closed loop feedback circuit with a magnetic sensor in a location to provide a control signal, exciting said magnetic sensor with an alternating signal and employing said control signal in a closed loop feedback system for producing a magnetic field flux of a magnitude and direction to cancel unwanted static and time varying magnetic flux.

2. A method according to claim 1, wherein said control signal is an analog signal.

3. A method according to claim 1, wherein said control signal is a digital signal.

4. A method according to claim 1, wherein said control signal is a combination of an analog and a digital signal.

5. A method according to claim 1, wherein said control signal is provided proportional to said unwanted time varying magnetic flux present at a given location in a given direction.

6. A method according to claim 5, wherein said magnetic sensor is located at said given location for sensing magnetic flux in said given direction.

7. Apparatus for providing a constant magnetic field environment in at least one direction for a device, said apparatus comprising a magnetic field generating coil for providing a magnetic field flux component in at least said one direction for altering the magnetic field flux in said one direction, means coupled to said coil for supplying energizing current of adjustable magnitude and polarity to said coil, and a closed loop feedback sensing circuit coupled to said energizing current supplying means for adjusting said energizing current and including a sensing element having a core, wherein said sensing element is disposed relative to said coil where said sensing element is exposed to any magnetic field produced by said coil, said closed loop feedback sensing circuit further comprising a signal source and a winding around said core, wherein said winding is coupled to said source for providing an electromagnetic field to maintain a balanced magnetomotive force within said sensor element.

8. Apparatus according to claim 7, wherein said device comprises a magnetic resonance imaging machine.

9. Apparatus according to claim 7, wherein said sensing element comprises a linear core of high permeability material disposed with its longitudinal axis oriented parallel to said one direction.

10. Apparatus according to claim 9, wherein said sensing element further comprises a first and second winding disposed about said linear core, said first and second windings each having an end connected to a common tap and a free end, and wherein said winding for maintaining a balanced magnetomotive force within said sensor element is at least a third winding wound about said linear core, and said closed loop feedback sensing circuit comprises source means coupled to said first and second windings for supplying a signal to said first and second windings, feedback means interconnecting at least said first winding with said third winding through said signal source, and means coupled to said third winding for supplying a controlling signal to said energizing current supplying means for adjusting said energizing current for said coil.

11. Apparatus according to claim 10, wherein said source means comprises an oscillator having a fundamental frequency, an amplifier having an input coupled to an output of said oscillator and having an output coupled to said first and second windings between said common tap and the free ends of said first and second windings for energizing in parallel said first and second windings, and an automatic gain control circuit coupled between said first winding and said amplifier for maintaining energization of said first and second windings at a constant level.

12. Apparatus according to claim 11, wherein said feedback means comprises an harmonic detector for detecting an even harmonic of said fundamental frequency and producing a feedback signal to said third winding in proportion to the magnitude of said even harmonic.

13. Apparatus according to claim 12, wherein said fundamental frequency is 2 KHz, and said even harmonic is the second harmonic.

14. Apparatus according to claim 13, wherein said sensing element further comprises a fourth winding wound about said linear core inductively coupled to said first, second and third windings, and means coupling said fourth winding to said feedback means for compensating for any of said undesired magnetic field flux varying at a rate in excess of the bandwidth of said first and second windings.

15. Apparatus according to claim 7, wherein said coil comprises a pair of coils wound each about a respective longitudinal axis and disposed coaxial with said one direction and spaced apart in said one direction with said device disposed in the space between said coils, said coils being connected in series for operation as a magnetic dipole to provide when energized said magnetic field flux component.

16. Apparatus according to claim 15, wherein said device comprises a magnetic resonance imaging machine.

17. Apparatus according to claim 15, wherein said core is a linear core of high permeability material disposed with its longitudinal axis oriented parallel to said one direction.

18. Apparatus according to claim 17, wherein said device comprises a magnetic resonance imaging machine.

19. Apparatus according to claim 18, wherein said sensing element further comprises a first and second winding disposed about said linear core, said first and second windings each having an end connected to a common tap and a free end, and wherein said winding for maintaining a balanced magnetomotive force within said sensor element is at least a third winding wound about said linear core, and said closed loop feedback sensing circuit further comprises source means coupled to said first and second windings for supplying a signal to said first and second windings, feedback means interconnecting at least said first winding with said third winding through said signal source and means coupled to said third winding for supplying a controlling signal to said energizing current supplying means for adjusting said energizing current of said coils.

20. Apparatus according to claim 19, wherein said device comprises a magnetic resonance imaging machine.

21. Apparatus according to claim 19, wherein said sensing element further comprises a fourth winding wound about said linear core, and means coupling said fourth winding to said feedback means for compensating for any of said undesired magnetic field flux varying at a rate in excess of the bandwidth of said first and second windings.

22. Apparatus according to claim 21, wherein said device comprises a magnetic resonance imaging machine.

23. Apparatus according to claim 19, wherein said source means comprises an oscillator having a fundamental frequency, an amplifier having an input coupled to an output of said oscillator and having an output coupled to said first and second windings between said common tap and the free ends of said first and second windings for energizing in parallel said first and second windings, and an automatic gain control circuit coupled between said first winding and said amplifier for maintaining energization of said first and second windings at a constant level.

24. Apparatus according to claim 23, wherein said device comprises a magnetic resonance imaging machine.

25. Apparatus according to claim 23 wherein said sensing element further comprises a fourth winding wound about said linear core, and means coupling said fourth winding to said feedback means for compensating for any of said undesired magnetic field flux varying at a rate in excess of the bandwidth of said first and second windings.

26. Apparatus according to claim 25, wherein said device comprises a magnetic resonance imaging machine.

27. Apparatus according to claim 23, wherein said feedback means comprises an harmonic detector for detecting an even harmonic of said fundamental frequency and producing a feedback signal to said third winding in proportion to the magnitude of said even harmonic.

28. Apparatus according to claim 27, wherein said device comprises a magnetic resonance imaging machine.

29. Apparatus according to claim 27, wherein said sensing element further comprises a fourth winding wound about said linear core, and means coupling said fourth winding to said feedback means for compensating for any of said undesired magnetic field flux varying at a rate in excess of the bandwidth of said first and second windings.

30. Apparatus according to claim 29, wherein said device comprises a magnetic resonance imaging machine.

31. Apparatus according to claim 27, wherein said fundamental frequency is 2 KHz, and said even harmonic is the second harmonic.

32. Apparatus according to claim 31, wherein said sensing element further comprises a fourth winding wound about said linear core, and means coupling said fourth winding to said feedback means for compensating for any of said undesired magnetic field flux varying at a rate in excess of the bandwidth of said first and second windings.

33. Apparatus according to claim 31, wherein said device comprises a magnetic resonance imaging machine.

34. Apparatus according to claim 31, wherein said sensing element further comprises a fourth winding wound about said linear core, and means coupling said fourth winding to said feedback means for compensating for any of said undesired magnetic field flux varying at a rate in excess of the bandwidth of said first and second windings.

35. Apparatus according to claim 34, wherein said device comprises a magnetic resonance imaging machine.

36. A method for providing a constant magnetic field environment which comprises in combination the steps of employing a closed loop feedback circuit with a magnetic sensor having a core, the sensor being in a location to provide a first control signal; employing said first control signal in a closed loop feedback system for producing a first magnetic field flux of a magnitude and direction to cancel unwanted magnetic flux; detecting asymmetric saturation of said core; providing a second control signal based on the detected asymmetric saturation of said core; and producing a second magnetic field flux based on said second control signal to restore symmetry of said core.

37. A method according to claim 36, wherein said first control signal is an analog signal.

38. A method according to claim 36, wherein said first control signal is a digital signal.

39. A method according to claim 36, wherein said first control signal is a combination of an analog and a digital signal.

40. A method according to claim 36, wherein said first control signal is provided proportional to said unwanted time varying magnetic flux present at a given location in a given direction.

41. A method according to claim 40, wherein said magnetic sensor is located at said given location for sensing magnetic flux in said given direction.

42. A method for providing a constant magnetic field environment comprising:
   exciting a magnetic sensor positioned within said magnetic field with an alternating signal from a signal source;
   detecting unwanted magnetic flux by said sensor; and
   providing a signal for producing a magnetic field flux to cancel the unwanted magnetic flux based on the detected flux.

43. The method of claim 42, wherein said sensor further comprises a core driven by said alternating current, and said unwanted magnetic flux is detected by detecting asymmetries in said core caused by said unwanted flux.

44. The method of claim 43, wherein said control signal is proportional to said asymmetry.

45. Apparatus for providing a constant magnetic field environment in at least one direction for a device, said apparatus comprising:
   a magnetic field generating coil for providing a magnetic field flux component in at least said one direction for altering the magnetic field flux in said one direction;
   means coupled to said coil for supplying energizing current of adjustable magnitude and polarity to said coil; and
   a closed loop feedback sensing circuit coupled to said energizing current supplying means for adjusting said energizing current, and including a source means and sensing element disposed relative to said coil where said sensing element is exposed to any magnetic field produced by said coil;
   wherein said sensing element comprises:
   a linear core;
   a first and second winding disposed about said linear core and connected to said source means; and
   at least a third winding wound around said linear core; and
   wherein said closed loop feedback sensing circuit further comprises feedback means interconnecting at least said first winding with said third winding and means coupled to said third winding for supplying a controlling signal to said energizing current supplying means for adjusting said energizing current for said coils.

46. Apparatus according to claim 45, wherein said third winding generates an electromagnetic field for balancing magnetomotive force in said linear core.

47. Apparatus according to claim 45, wherein said linear core comprises a high permeability material disposed with its longitudinal axis oriented parallel to said one direction.

48. Apparatus according to claim 45, wherein said coil comprises a pair of coils wound each about a respective longitudinal axis and disposed coaxial with said one direction and spaced apart in said one direction with said device disposed in the space between said coils, said coils being connected in series for operation as a magnetic dipole to provide when energized said magnetic field flux component.

49. Apparatus according to claim 45, wherein said sensing element further comprises a fourth winding wound about said linear core and said closed loop feedback sensing circuit further comprises means coupling said fourth winding to said feedback means for compensating for any of said undesired magnetic field flux varying at a rate in excess of the bandwidth of said first and second windings.

50. Apparatus according to claim 45, wherein said feedback means comprises an harmonic detector for detecting an even harmonic of said fundamental frequency and producing a feedback signal to said third winding in proportion to the magnitude of said even harmonic.

51. Apparatus according to claim 45, wherein said feedback means comprises means for detecting asymmetry in said linear core.

52. Apparatus according to claim 45, wherein said device comprises a magnetic resonance imaging machine.

53. Apparatus for providing a constant magnetic field environment in at least one direction for a device, comprising:
   a magnetic field generating coil for providing a magnetic field flux component in at least said one direction for altering the magnetic field flux in said one direction;
   means coupled to said coil for supplying energizing current of adjustable magnitude and polarity to said coil; and
   a closed loop feedback sensing circuit coupled to said energizing current supplying means for adjusting said energizing current and including a sensing element disposed relative to said coil such that said sensing element is exposed to any magnetic field produced by said coil,
   said sensing element comprising a core and said circuit comprising an alternating signal source for exciting the core with an alternating signal.

54. The apparatus of claim 53, wherein said feedback circuit further comprises a second signal source and a winding connected to said second signal source and inductively coupled to said core, for producing a second electromagnetic field for balancing magnetomotive force within said sensor.

55. Apparatus of claim 54, further comprising first and second windings each having an end coupled to a common tap coupled to said alternating signal source, said first and second windings being inductively coupled to said core.

56. Apparatus of claim 55, wherein said circuit further comprises a third winding and a second signal source, wherein said third winding is connected to said second signal source and is inductively coupled to said core, and
   wherein said closed loop feedback sensing circuit comprises feedback means interconnecting at least said first winding with said third winding, said third winding for providing an electromagnetic field for maintaining a balanced magnetomotive force within said core.

57. Apparatus of claim 56, wherein said closed loop feedback sensing circuit comprises means coupled to said third winding for supplying a controlling signal to said energizing current supplying means for adjusting said energizing current for said coils.

58. Apparatus of claim 55, wherein said closed loop feedback sensing circuit further comprises means for supplying a controlling signal to said energizing current supply means for adjusting said coils, said means for supplying being coupled to said first winding.

59. Apparatus of claim 58, further comprising an oscillator having a fundamental frequency, coupled to the first and second windings between said common tap, and
   said closed loop feedback sensing circuit further comprises an harmonic detector for detecting an even harmonic of said fundamental frequency, between said first winding and said means for supplying.

* * * * *

UNITED STATES PATENT AND TRADEMARK OFFICE
CERTIFICATE OF CORRECTION

PATENT NO. : 5,952,734

DATED : September 14, 1999

INVENTOR(S) : MARK GELBIEN

Page 1 of 1

It is certified that error appears in the above-identified patent and that said Letters Patent is hereby corrected as shown below:

Column 3, line 58, after "varying" insert --and--.

Column 6, line 32, after "core" delete "inductively coupled to said first, second and"; line 33, before "and" delete "third windings,".